US009831201B2

(12) United States Patent
Burgess et al.

(10) Patent No.: US 9,831,201 B2
(45) Date of Patent: Nov. 28, 2017

(54) METHODS FOR FORMING PILLAR BUMPS ON SEMICONDUCTOR WAFERS

(71) Applicants: Guy F. Burgess, Gilbert, AZ (US); Theodore Gerard Tessier, Chandler, AZ (US); Anthony Paul Curtis, Queen Creek, AZ (US); Lillian Charell Thompson, Phoenix, AZ (US)

(72) Inventors: Guy F. Burgess, Gilbert, AZ (US); Theodore Gerard Tessier, Chandler, AZ (US); Anthony Paul Curtis, Queen Creek, AZ (US); Lillian Charell Thompson, Phoenix, AZ (US)

( * ) Notice: Subject to any disclaimer, the term of this patent is extended or adjusted under 35 U.S.C. 154(b) by 142 days.

(21) Appl. No.: 14/644,473

(22) Filed: Mar. 11, 2015

(65) Prior Publication Data

US 2016/0268223 A1  Sep. 15, 2016

(51) Int. Cl.
*H01L 23/00* (2006.01)

(52) U.S. Cl.
CPC .............. *H01L 24/11* (2013.01); *H01L 24/03* (2013.01); *H01L 24/05* (2013.01); *H01L 24/13* (2013.01); *H01L 24/14* (2013.01); *H01L 2224/0345* (2013.01); *H01L 2224/0346* (2013.01); *H01L 2224/0347* (2013.01); *H01L 2224/0361* (2013.01); *H01L 2224/03426* (2013.01); *H01L 2224/03452* (2013.01); *H01L 2224/03462* (2013.01); *H01L 2224/03464* (2013.01); *H01L 2224/03912* (2013.01); *H01L 2224/0401* (2013.01); *H01L 2224/05073* (2013.01); *H01L 2224/05082* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); (Continued)

(58) Field of Classification Search
CPC ................................. H01L 24/11; H01L 24/13
See application file for complete search history.

(56) References Cited

U.S. PATENT DOCUMENTS 5,716,663 A   2/1998   Capote
5,922,397 A   7/1999   Brandt
(Continued)

FOREIGN PATENT DOCUMENTS

| EP | 793405 A2 | 9/1997 |
| WO | 2014082100 | 5/1995 |
| WO | 2014082100 | 5/2014 |

OTHER PUBLICATIONS

Alternatives to Solder in Interconnect, Packaging, and Assembly, Herbert Neuhaus, USA Journal of Surface Mount Technology, 2013.
(Continued)

*Primary Examiner* — Errol Fernandes

(57) ABSTRACT

The subject matter contained herein discloses methods for forming a vertical metallic pillar overlying an under bump metal pad further overlying a semiconductor substrate, and applying a discrete solder cap on a top surface of the pillar, wherein the metallic pillar is defined by at least one photoresist layer. The method includes heating a multi-element metallic paste containing a variable amount of metallic powder, a melting point depressant and a flux such that the metal powder sinters to form the metallic pillar and simultaneously adheres the metallic pillar to the underbump metal pad.

25 Claims, 6 Drawing Sheets

(52) U.S. Cl.
CPC ............... *H01L 2224/05171* (2013.01); *H01L 2224/05172* (2013.01); *H01L 2224/05184* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/05671* (2013.01); *H01L 2224/05672* (2013.01); *H01L 2224/05684* (2013.01); *H01L 2224/119* (2013.01); *H01L 2224/1132* (2013.01); *H01L 2224/1147* (2013.01); *H01L 2224/11474* (2013.01); *H01L 2224/11505* (2013.01); *H01L 2224/11849* (2013.01); *H01L 2224/11902* (2013.01); *H01L 2224/132* (2013.01); *H01L 2224/133* (2013.01); *H01L 2224/13006* (2013.01); *H01L 2224/13007* (2013.01); *H01L 2224/13012* (2013.01); *H01L 2224/13013* (2013.01); *H01L 2224/13014* (2013.01); *H01L 2224/1332* (2013.01); *H01L 2224/13294* (2013.01); *H01L 2224/13301* (2013.01); *H01L 2224/13305* (2013.01); *H01L 2224/13309* (2013.01); *H01L 2224/13311* (2013.01); *H01L 2224/13313* (2013.01); *H01L 2224/13316* (2013.01); *H01L 2224/13318* (2013.01); *H01L 2224/13324* (2013.01); *H01L 2224/13339* (2013.01); *H01L 2224/13344* (2013.01); *H01L 2224/13347* (2013.01); *H01L 2224/13355* (2013.01); *H01L 2224/13364* (2013.01); *H01L 2224/1403* (2013.01); *H01L 2224/14051* (2013.01); *H01L 2924/00015* (2013.01); *H01L 2924/0103* (2013.01); *H01L 2924/014* (2013.01); *H01L 2924/0105* (2013.01); *H01L 2924/01013* (2013.01); *H01L 2924/01022* (2013.01); *H01L 2924/01023* (2013.01); *H01L 2924/01024* (2013.01); *H01L 2924/01028* (2013.01); *H01L 2924/01029* (2013.01); *H01L 2924/01031* (2013.01); *H01L 2924/01046* (2013.01); *H01L 2924/01047* (2013.01); *H01L 2924/01048* (2013.01); *H01L 2924/01049* (2013.01); *H01L 2924/01051* (2013.01); *H01L 2924/01074* (2013.01); *H01L 2924/01079* (2013.01); *H01L 2924/01082* (2013.01); *H01L 2924/01083* (2013.01)

(56) References Cited

U.S. PATENT DOCUMENTS

| | | | |
|---|---|---|---|
| 6,130,195 A * | 10/2000 | Doyel | C11D 3/2068 510/174 |
| 2004/0261980 A1 | 12/2004 | Dani | |
| 2010/0013094 A1* | 1/2010 | Jo | H01L 21/563 257/738 |
| 2010/0252616 A1 | 10/2010 | Shearer | |
| 2011/0171372 A1 | 7/2011 | Shearer | |
| 2011/0292567 A1 | 12/2011 | McConnell | |
| 2012/0321805 A1 | 12/2012 | Takahashi | |
| 2013/0196499 A1 | 8/2013 | Burgess | |
| 2014/0042212 A1 | 2/2014 | Shearer | |
| 2014/0087210 A1 | 3/2014 | Keane | |
| 2014/0110153 A1 | 4/2014 | Takafumi | |
| 2014/0120356 A1 | 5/2014 | Shearer | |
| 2014/0131898 A1 | 5/2014 | Shearer | |
| 2014/0231126 A1 | 8/2014 | Hunrath | |

OTHER PUBLICATIONS

Transient-Phase Compounds, Hannes Greve, ASME 2013 International Technical Conference and Exhibition on Packaging and Intergration of Electronic and Photonic Microsystems.

Recent Advances on Electrically Conductive Adhesives, Rongwei Zhang, Electronics Packaging Technology Conference, 2010.

Review of Recent Advances in Electrically Conductive Adhesive Materials and Technologies in Electronic Packaging, Myung Jin Yimam Journal of Adhesion Science and Technology vol. 22. Issue 14, 2008.

\* cited by examiner

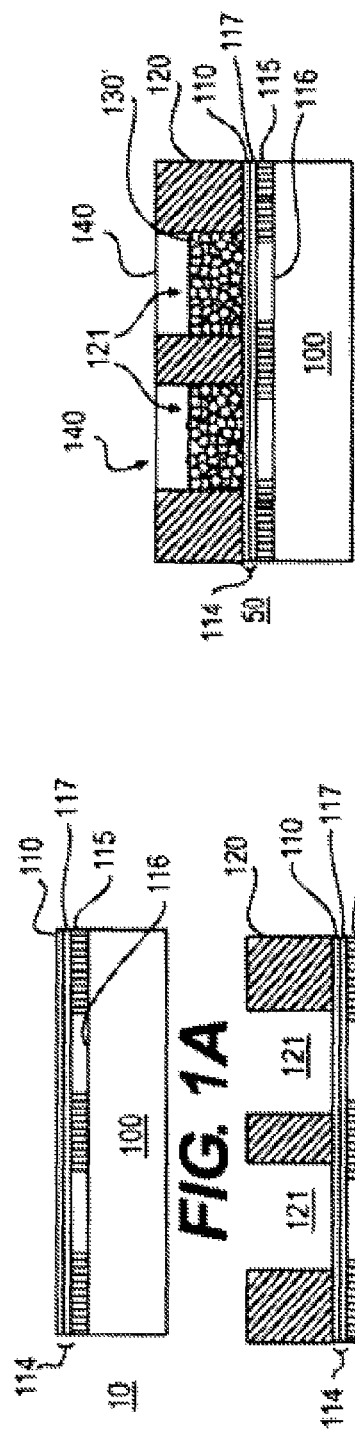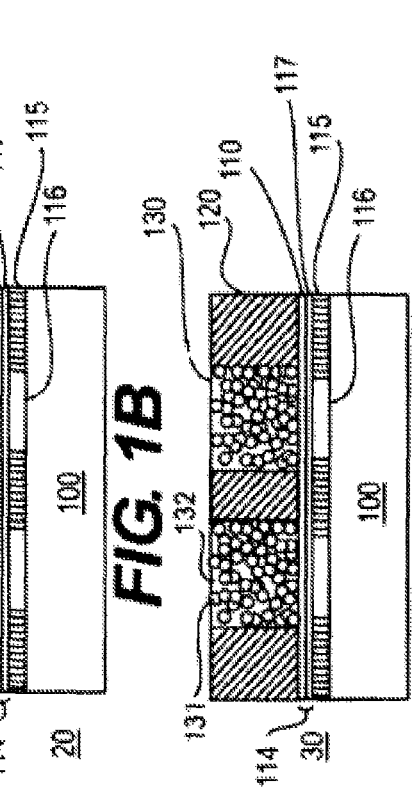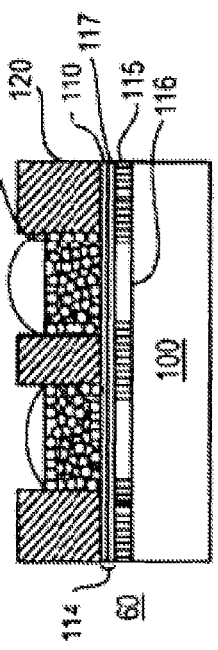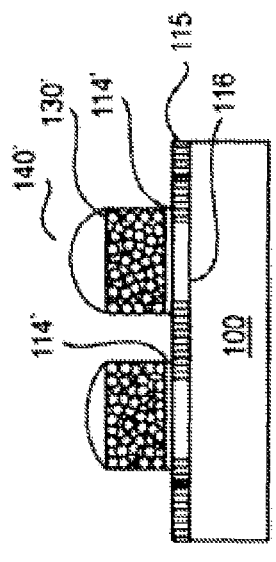

METHODS FOR FORMING PILLAR BUMPS ON SEMICONDUCTOR WAFERS

TECHNICAL FIELD

The present disclosure generally relates to improved structures and methods for manufacturing semiconductor devices, and more particularly relates to structures and methods for forming metallic pillars on a semiconductor substrate. Such structures and methods are particularly useful for bumping electronic devices in wafer-level chip-scale packaging and flip-chip packaging.

BACKGROUND

Metallic pillars or pillar bumps, which are one type of vertical interconnect technology, can be attached to bond pads or redistribution metal pads of semiconductor chips or other microelectronic devices via metallic pillar electroplating technologies that are known to those familiar with the art. The term "pad" as used herein is a layered metal structure deposited on a substrate as is well known in the art.

The metallic pillars are placed on the chips/devices while the chips/devices are still in their wafer form. Metallic pillars (e.g., copper, gold, or other metals/alloys) have the potential to be used as functional under bump metallurgy ("UBM") and as plated vertical extensions with solder caps, provided that reliable and efficient methods can be developed to form the pillars on the wafer seed layer. Typically, solder ball based flip-chip ("FC") and/or chip scale package ("CSP") style interconnects (or "solder bumps") require suitable UBM pads to act as adhesion layers and/or diffusion barriers between the wafer/substrate metallization and the solder bump itself. These types of solder ball interconnects also require sufficient area on the device surface so they do not short together during processing or subsequent assembly of the device to another substrate material.

A metallic pillar or pillar bump offers a rigid but highly adjustable vertical structure (e.g., in the z-direction) when compared to typical solder bump or solder ball CSP interconnects. In applications where narrow interconnect pitch and control of the stand-off distance between two surfaces is required, such as between a device and its associated substrate, the metallic pillar bump acts as a fixed standoff interposer to control that distance, while a smaller solder cap performs the joint connection between the device and substrate. Controlling this stand-off distance is important to overall system performance and reliability.

Metallic pillars are currently formed using a multiple step process which includes electrodeposition (e.g., electroplating or plating) of the metallic pillar comprised of one or more metal layers including the option of an additional electrodeposition of a solder "cap". Typically, metallic pillars are plated by electrodeposition directly onto a metal seed layer over underlying metal bond pads on the semiconductor wafer. The overall process of using this series of electrodeposition steps can be costly and time-intensive. An alternate method which incorporates the same electrodeposition of the metallic pillar but with a printed solder cap was introduced to the industry by the Assignee hereof. While this eliminates the solder plating time needed, there still remains a time-intensive plating of the metallic pillar. Co-owned, co-pending U.S. patent Ser. No. 12/828,003 describes additional information concerning the electroplating of metallic pillars and is hereby incorporated by reference in its entirety.

Known metallic pillar bump manufacturing methods use a photo-definable mask material (e.g., photoresist) into which to electroplate and form the pillar structure crowned by an electroplated solder amount. Plating the solder is a slow, expensive process that requires considerable process control. Plating also limits the preferred solder to a common binary solder alloy. It is known that electroplating a more complex material than a binary solder alloy to form the solder portion of the pillar bump is very difficult to control in a manufacturing environment.

Metallic pillar bump structures also offer improved thermal transfer and conductivity compared to equivalent FC or CSP solder bump stand-offs. Metallic pillar bump structures have the potential to be a cost-effective, reliable interconnect option for certain markets in the microelectronics industry. However, reliable and lower cost manufacturable methods as alternative to electrodeposition are needed for building reliable, cost effective fixed stand-off metallic pillar structures.

The following detailed description is merely exemplary in nature and is not intended to limit the invention or to limit the applications and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

BRIEF SUMMARY

A method for creating a metallic pillar on a metallic base layer of a semiconductor device, comprising depositing a photoresist layer over the metallic base layer and creating an opening in the photoresist layer having a total volume that is configured to expose the metallic base layer and is further configured to define the metallic pillar. The method further comprises substantially filling the total volume of the opening in the photoresist layer with a multi-element metallic paste comprising a metallic portion and a non-metallic portion, at least partially driving off the non-metallic portion of the multi-element metallic paste by heating the multi-element paste to a sintering temperature of the metallic portion of the multi-element metallic paste, whereby a bottom portion of the total volume of the opening in the photoresist layer retains the sintered metallic portion of the multi-element metallic paste and a top portion of the total volume is empty. After sintering, substantially filling the empty top portion of the total volume with a solder paste, forming a solder cap by heating the solder paste to a reflow temperature of the solder paste, and stripping away the photoresist layer.

A method for creating a metallic pillar on a metallic base layer of a semiconductor device, comprising depositing a photoresist layer over the metallic base layer, creating an opening in the photoresist layer having a total volume, and substantially filling the total volume of the opening in the photoresist layer with a multi-element metallic paste comprising a metallic portion and a non-metallic portion. Then the non-metallic portion of the multi-element metallic paste is at least partially driven off by heating the multi-element paste to a sintering temperature of the metallic portion of the multi-element metallic paste, whereby a bottom portion of the total volume of the opening in the photoresist layer retains the sintered metallic portion of the multi-element metallic paste and a top portion of the total volume is empty.

BRIEF DESCRIPTION OF THE DRAWINGS

For a more complete understanding of the present disclosure, reference is now made to the following figures:

FIGS. 1A-G illustrate a method for creation of metallic pillar bump structures atop a metallic base layer covering an underlying metal pad on a semiconductor wafer device;

Figure 2A:
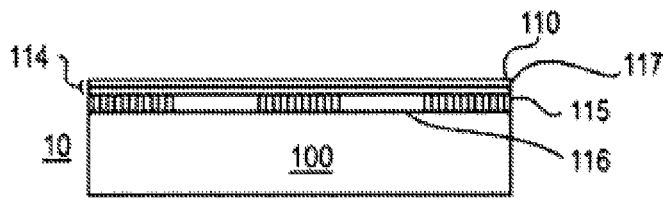
FIGS. 2A-G illustrate a method for creation of metallic pillar bump structures atop a metallic base layer covering an underlying metal pad on a semiconductor wafer device with the electrodeposition of a bonding layer of enhanced thickness.

The exemplification set out herein illustrates particular exemplary embodiments, and such exemplification is not intended to be construed as limiting in any manner.

DETAILED DESCRIPTION

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The disclosed process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements unless so stated. For example, two elements may be connected to each other physically, electronically, logically, or in any other manner, through one or more additional elements.

"About" or "approximately" as used herein, means that a number referred to as "about" or "approximately" comprises the recited number plus or minus 1-10% of that recited number. For example, about 50 degrees can mean 45-55 degrees or as few as 49-51 degrees depending on the situation. Whenever it appears herein, a numerical range, such as "45-55", refers to each integer in the given range; e.g., "45-55%" means that the percentage can be 45%, 46%, etc., up to and including 55%. Where a range described herein includes decimal values, such as "1.2% to 10.5%", the range refers to each decimal value of the smallest increment indicated in the given range; e.g. "1.2% to 10.5%" means that the percentage can be 1.2%, 1.3%, 1.4%, 1.5%, etc. up to and including 10.5%; while "1.20% to 10.50%" means that the percentage can be 1.20%, 1.21%, 1.22%, 1.23%, etc. up to and including 10.50%.

As used herein, the term "substantially" refers to a great extent or degree. For example, "substantially" typically refers to at least about 90% plus or minus 10%., frequently at least about 95%, often at least 99%, and more often at least about 99.9%.

The term "alloy" refers to a substance containing two or more metals, and optionally additional non-metals, where the elements of the alloy are fused together or dissolved into each other when molten. Alloy is used herein as opposed to a multi-element "mixture," which is a substance (e.g., a paste) that contains two or metals and/or metal alloys and/or non-metals, where the elements of the mixture are not, or not yet, fused together or dissolved into each other at all.

Trends in technology continue to progress towards further miniaturization of electronic devices with ever increasing functionality to meet the progression of technology. Wafer level metallic pillar technologies meet high power applications through specific pillar design. Wafer level metallic pillar bumping technology achieved through electrodeposition, although relatively expensive, is a well-established means for providing high density, fine pitched interconnections to and between integrated circuit chips while permitting high volume assembly processes.

The sintering methods described herein below provide more efficient means for achieving metallic pillar creation by using sintering processes, which are less expensive and faster than conventional electroplating methods accepted in the art. The term "sinter" as used herein refers to the process of forming a solid mass of material by heating the material without melting it to the point of liquefaction. Sintering per se occurs in mineral deposits or is used as a manufacturing process with metals, ceramics, plastics, and other materials. The atoms in the sinter material diffuse across the physical boundaries of larger particles thereby fusing the larger particles together and creating one solid piece. Because the sintering temperature does not have to reach the melting point of the material, sintering under pressure is often chosen as the shaping process for materials with otherwise inconveniently high melting points. The study of sintering in metallurgy powder-related processes is known as powder metallurgy.

There are different techniques to induce sintering. An exemplary technique is called "liquid phase sintering" that is useful for materials which are difficult to sinter using a typical method combining temperature and pressure. Instead of using pressure, liquid phase sintering uses an additive to a metallic powder(s) which will melt before the metallic powder(s). The additive is known as a melting point depressant ("MPD").

The process of liquid phase sintering as is known in the art has three stages. The first stage is "rearrangement." As the MPD melts, capillary action will pull the liquid MPD into pores of and spaces between the metallic powder, thereby allowing grains of the metallic powder to shift and rearrange into a more favorable packing arrangement. The second stage is "solution-precipitation." In areas where capillary pressures are high (e.g., where particles are close together) metallic powder atoms will preferentially go into solution and then precipitate in areas of lower chemical potential where particles are not close or in contact. This is called "contact flattening," which densifies the system in a way similar to grain boundary diffusion in solid state sintering. "Ostwald ripening" also occurs where smaller particles will go into solution preferentially and precipitate on larger particles leading to densification. The third stage is "final densification" where atoms move from efficiently packed regions into pores in the general matrix being created. For liquid phase sintering to be practical, the solid phase metal powder should be at least slightly soluble in the liquid phase and the MPD should melt before any major sintering of the solid particulates occurs, otherwise rearrangement of grains will not occur.

"Soldering" is a process in which two or more metal items are joined together by melting and flowing a filler metal into the space between metal items, with the filler metal having a lower melting point than the adjoining metal. The formation of the pillar bump described herein can also be described as a soldering process as the lower melting point components (or MPD components) melt during the sintering/heating process and flow around the non-molten metal components, bonding the structure together. The method described herein for forming the pillar bump structure includes the use of any soldering type of process where there is a "solder wetting" of a lower melting point component to fill around and join together the other metal components of the pillar structure.

FIGS. 1A-G illustrate an exemplary embodiment of a method that may be used to produce a metallic pillar bump using a liquid phase sintering process. In the drawings, like numerals indicate like components throughout.

FIG. 1A illustrates a passivated or re-passivated semiconductor with metallic base layer(s) 114 overlying an existing patterned metal bond pad 116 and passivation material 115. Passivation layer 115 can be comprised of one or more layers of any type or thickness of inorganic or organic passivation layer used in the industry including passivation layers used for the redistribution of metal pads. In process 10, one or more metallic base layers 114 are deposited over a passivation layer 115 using any suitable deposition method known in the art. Exemplary, non-limiting methods of deposition include but are not limited to physical and chemical thin-film deposition techniques such as physical vapor deposition, plating, chemical solution deposition, chemical vapor deposition, and evaporation.

The metallic base layer(s) 114 may comprise multiple layers, each comprised of a different metal or metal alloy. As a non-limiting example, the metallic base layer 114 may comprise a first layer 117 (e.g., an adhesion layer) comprising about 1500 Å of titanium (Ti) and an outer bonding layer 110 of about 10,000 Å of copper (Cu). Other metals that may be used to create adhesion layers, barrier layers and bonding/solderable layers within the metallic base layer 114 and may include, but are not limited, to Al, Ti, Cu, W, Cr, V, Ni, NiV, Au, Ag and alloys thereof. In practice, the outer bonding layer 110 may range in thickness from under 50 Å to over 100,000 Å. Preferably the outer bonding layer ranges in thickness from 10,000 Å to 70,000 Å, and more preferably from 5000 Å to 15,000 Å.

The outer bonding layer 110 is also referred to herein as the bonding layer. For simplicity and ease of explanation, the metallic base layer 114 will be considered infra as being a single bonding layer 110 of copper covering an adhesion layer 117 of titanium. It should be noted that in equivalent processes described infra, portions of the metallic base layer 114 may ultimately form prominent under bump metallurgy (UBM) on which the metallic pillar will attach.

FIG. 1B illustrates the semiconductor device 100 with a resist layer 120 applied. At process 20, the photodefinable resist layer 120 is deposited (e.g., laminated, spin coated, or spray coated, etc.) over the entire metallic base layer 114 using standard photolithographic processes. The photoresist layer 120 may be any suitable photoresist layer known in the art. Further, openings 121 are created, or developed, in the photoresist layer 120 by any suitable chemical or mechanical means known in the art. The openings 121 define the size and shape of the to-be-created metallic pillar. Typically, the depth of the opening 121 will be about the desired height of the metallic pillar (not shown) plus the height of the desired solder cap (not shown). The depth of the opening 121 can also be substantially greater or shorter than the desired height of the metallic pillar (not shown) plus the height of the desired solder cap (not shown). The opening 121 may be circular, oval, elongated with oval ends, or polyangular such as triangular, rectangular, pentagonal, octagonal and the like and have a pre-determined total volume. The total volume of opening 121 in the photoresist layer can range from 2,000 cubic microns to 50,000,000 cubic microns.

FIG. 1C illustrates the semiconductor 100 with the openings 121 in the resist layer 120 whose total volume is filled with a multi-element metallic paste such as a metal powder/MPD/flux mixture 130 during process 30. The powder/flux/MPD mixture 130 contains a metallic portion such as a powdered metal/alloy 131 that will constitute the metallic pillar (not shown), and a flux/MPD mixture 132. Exemplary, non-limiting examples of metals/alloys that may be used in the powder/flux/MPD mixture 130 include Cu, Ni, Pd, Pb, Al, Au, Ag, Zn, Sn, Bi, Sb, Cd, Ga, and In. The metallic particles within the multi-element metallic paste can range in size from 0.4 um in diameter to 60 um in diameter. The primary determination for the preferred particle size within this range is determined by the diameter of opening 121 and the ability of current techniques or techniques that may be developed in the future to fill the opening.

A flux is a non-metallic portion of the multi-element metallic paste and may be any suitable volatile chemical cleaning agent, flowing agent, or purifying agent known in the art. A flux performs its function at temperature and is driven off as a liquid or vapor at sinter temperature. As used herein, the flux may be any suitable flux material that may be commonly used, or developed in the future for use in manufacturing semiconductor devices.

The MPD is a melting point depressant and may be any metal/alloy with a melting point below that of the metal powder 131. Exemplary, non-limiting examples of an MPD that may be used in conjunction with the subject matter disclosed herein above include metal/alloys of Sn, Ag, Cu, Ni, Bi, Pb, Sb, Cd, In, Ga, and Zn. Further, an alloy of tin, silver and copper (a "SAC alloy") may also be used as the MPD.

In its unheated form, the powder/flux/MPD mixture 130 is physically applied into the opening 121 by any suitable method known in the art, such as by printing or stenciling. The powder/flux/MPD 130 may comprise a varying amount of its components as may be required to produce the desired size of the metallic pillar. Given a specified physical depth and circumference of the opening(s) 121, the amount of flux may vary between about 10% and about 90% of the total volume of the opening(s) 121. The more metallic powder 131 plus MPD (together between about 90% and 10% of total volume) relative to the amount of flux, the taller the metallic pillar is as the final product, as will be further explained infra.

FIG. 1D illustrates the semiconductor device 100 after sintering at process 40. As the temperature of the metallic powder/MPD/Flux mixture 130 increases past the melting point of the MPD, but remains below the melting point of the metallic powder 131, the flux performs its function as a flowing and anti-oxidation agent and is ultimately driven off as a liquid or a vapor. The combined sintered volume mass of the metallic pillar 130' (i.e., the metal powder plus any residual MPD) remains in the bottom portion of the opening 121 of the photoresist layer 120 and has simultaneously been adhered to the bonding layer 110 by the same sintering process. Hence, when the volume of the flux in the metallic powder/MPD/Flux mixture 130 is at the 10% end of the total volume range, then the bottom portion of the total volume of the opening 121 remains filled with the remaining 90% of total volume comprising sintered metallic powder and MPD and becomes the metallic pillar. Conversely, when the volume of the flux in the metallic powder/MPD/Flux mixture 130 is 90% of the total volume range, then the bottom portion of the opening 121 remains filled with the remaining 10% of the total volume of mixture 130 comprising sintered metallic powder and residual MPD. Thus, the size of the metallic pillar 130' can be varied by the thickness of the photoresist layer 120 and by the percent volume of the metallic powder 131 and MPD 132 comprising the metallic powder/MPD/Flux mixture 130.

FIG. 1E illustrates the semiconductor device 100 after printing in solder 140 at process 50. After sintering and the resulting reduction of the metallic powder/MPD/Flux mixture 130, an amount of solder 140 is deposited into the now empty top portion of the opening 121 in the photoresist layer 120. The solder 140 may be deposited by any suitable means known in the art. An exemplary, non-limiting methods of deposition may be printing or stenciling. The sintered metallic portion at the top portion of the opening 121 may also be cleaned of flux residue before the solder is deposited by cleaning the wafer in solution(s) such as but not limited to solvents, DI water, or saponifying chemistries and then dried. The wafer can also be cleaned prior to solder deposition using dry cleaning methods such as but not limited to plasma descum.

FIG. 1F illustrates the semiconductor device 100 after reflow heating at process 60, where the semiconductor device is heated to the reflow temperature of the solder 140. The reflow allows the solder 140 to form a solder cap 140' that is bonded to the metallic pillar 130'.

FIG. 1G illustrates the semiconductor device 100 in its final form after subtractive process 70 has been performed to remove all of the photoresist layer 120 and all of the excess exposed metallic base layer 114 from the pacified semiconductor 100. The portion of the metallic base layer remaining 114' after the subtractive process under the pillar 130' constitutes the UBM 114'. It should be noted that in the embodiment of FIG. 1G the metallic pillar 130' is situated entirely on the UBM 114' and is bonded to only the upper surface thereof.

FIGS. 2A-G illustrate an exemplary embodiment of an extended method that may be used to produce a metallic pillar bump using a sintering process. Like numerals indicate like components throughout the drawings and indicate similar components and processes to those in FIGS. 1A-1G. In regard to the following discussion, FIGS. 2A-G correspond essentially to FIGS. 1A-G. The salient difference in the method of FIGS. 2A-G from that of FIGS. 1A-G is the deposition of an additional bonding metal layer 150 at process 80 (See, FIG. 2B') that will become part of the UBM (114'+150) (See, FIG. 2G) under the metallic pillar 130'. Because of the redundancy between FIGS. 1A-G and FIGS. 2A-G, FIGS. 2A-G will not be discussed again in detail.

Figure 2B:
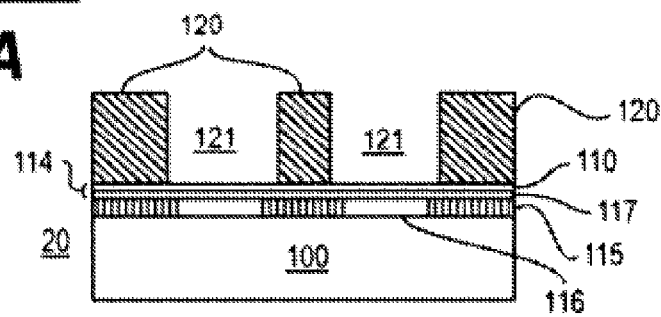
Figure 2B:
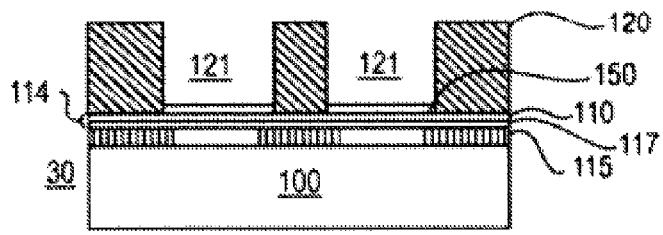
Figure 2C:
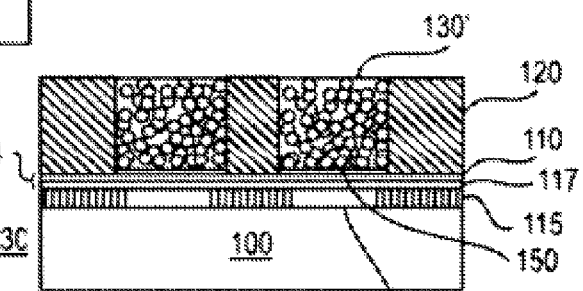
Figure 2D:
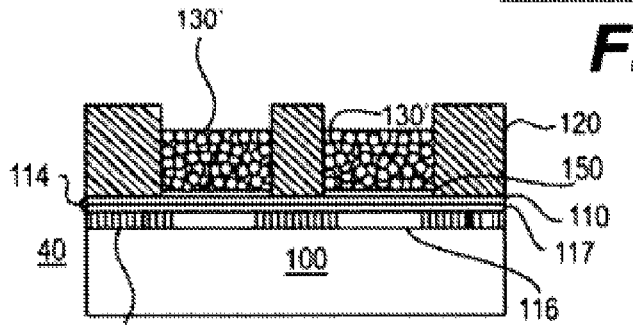
Figure 2E:
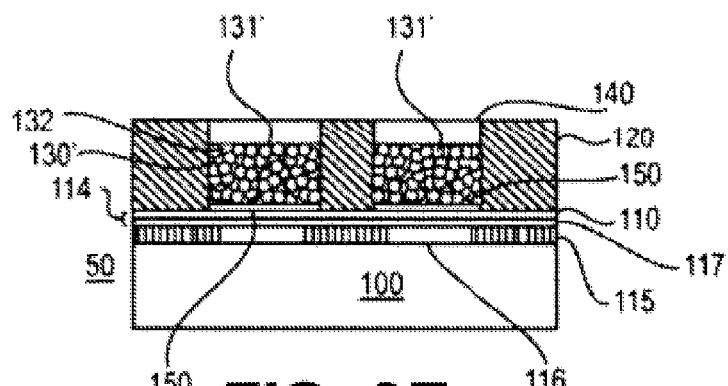
Figure 2F:
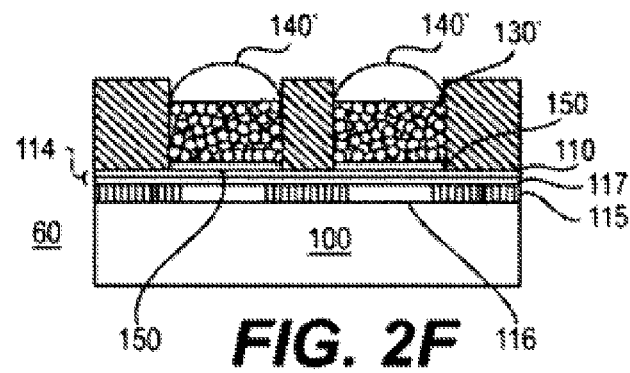
Figure 2G:
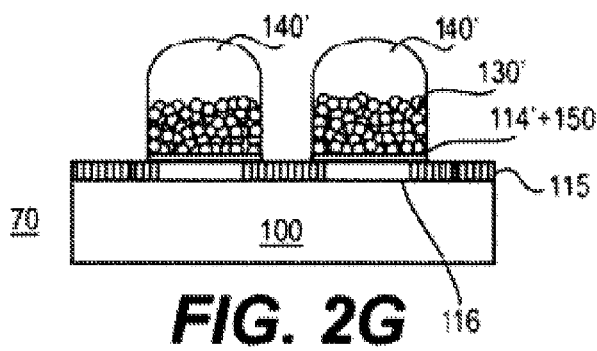

FIG. 2B' is an illustration of the semiconductor device 100 after process 80 wherein an additional bonding layer 150 is deposited at the location of the UPM 114' in opening(s) 121. To save on cost and time, it may be desirable to apply a thinner bonding layer 110 across the entire surface of the semiconductor device 100 and then increase its thickness at process 80 before applying the powder/flux/MPD mixture 130 into openings 121 at process 30 by using additive methods in an additional deposition loop such as electroplating, electroless plating, and the like. In this embodiment, metallic base layer 110 acts as a conventional seed layer.

FIGS. 3A-G illustrate an exemplary embodiment of an equivalent method that may be used to produce a metallic pillar bump using a sintering process. Like numerals indicate like components throughout the drawings and indicate similar components and processes to those illustrated in FIGS. 1A-G. In regard to the following discussion, FIGS. 3A-G correspond essentially to FIGS. 1A-G. The salient difference in the method of FIGS. 3A-G from that of FIGS. 1A-G is the creation of a conventional UBM 114' under the metallic pillar 130' at (See, FIG. 3A') by using an additional photoresist masking followed by an etching process 90 before the photoresist layer 120 in formed at process 20. Because of the redundancy between FIGS. 1A-G and FIGS. 2A-G, these figures will not be discussed again in detail.

Figure 3A:
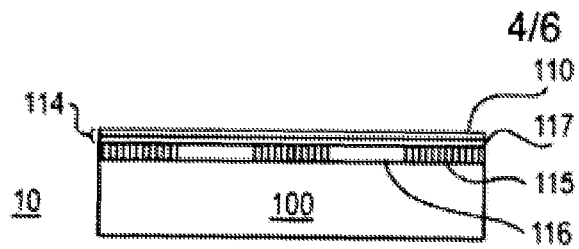
FIGS. 3A-G illustrate a method for creation of metallic pillar bump structures atop and around a defined metallic base which covers an underlying metal pad on a semiconductor wafer device.
Figure 3A:
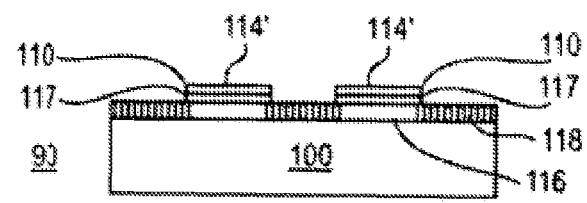

FIG. 3A' is an illustration of the semiconductor device 100 after the adhesion layer 117 and bonding layer 110 (i.e., together the metallic base layer 114) are deposited in process 10. At process 90, most of the metallic base layer 114 is removed from the surface of the semiconductor device 100 by applying a conventional photoresist and masking of the intended UBM site. Thus, forming the conventional UBM pad '114 by etching away layers 110 and 117 except in the area covering the pre-existing metal bond pad 116 and in any additional extended area around the UBM which is desired to remain. The residual metallic base layer 110 becomes the UBM 114'.

Figure 3B:
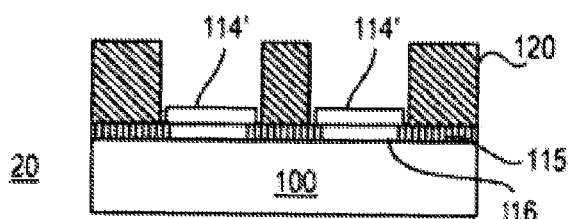
Figure 3C:
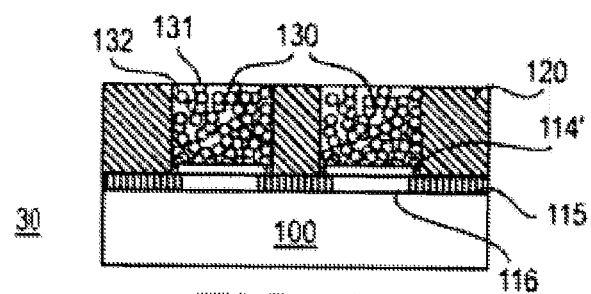
Figure 3D:
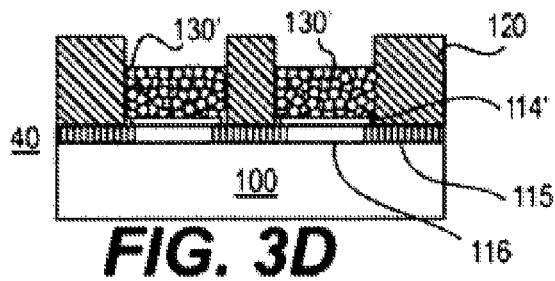
Figure 3E:
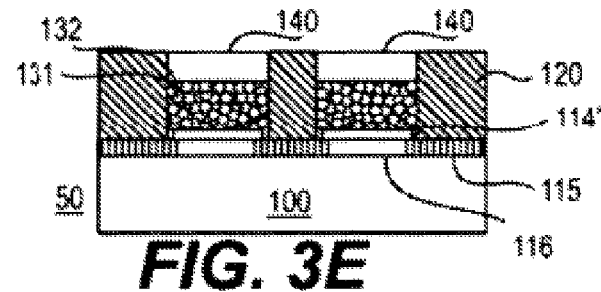
Figure 3F:
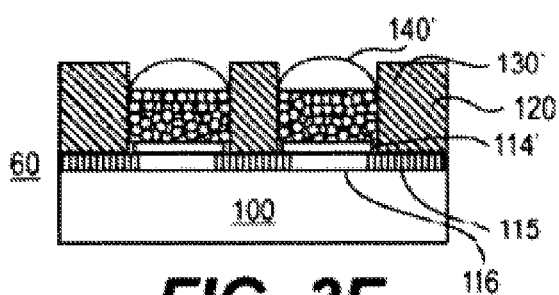
Figure 3G:
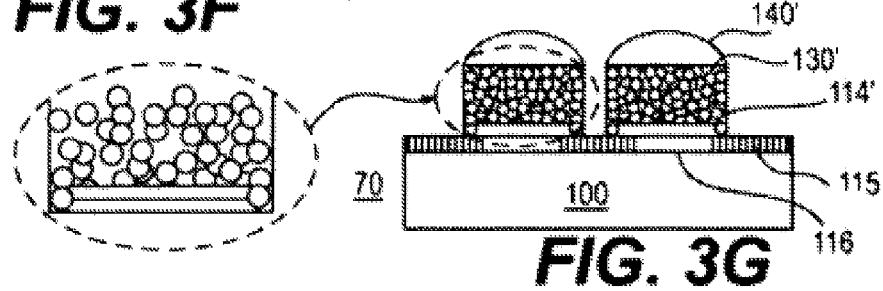

It should be pointed out that when the photoresist layer 120 is deposited in process 20 of FIG. 3B, the photoresist layer 120 can either surround the perimeter of the UBM 114' (as shown) or have some level of the photoresist layer on top of a broader area of the UBM 114' (not shown). The photoresist layer then either fully or mostly extends all the way to the pre-existing passivation layer 115, if any, of the semiconductor device 100. The arrangement with the photoresist surrounding the perimeter of the UBM 114' allows the powder/flux/MPD mixture 130 that is deposited in the subsequent process 30 to surround UPM 114' and bond to its side edges.

Figure 4:
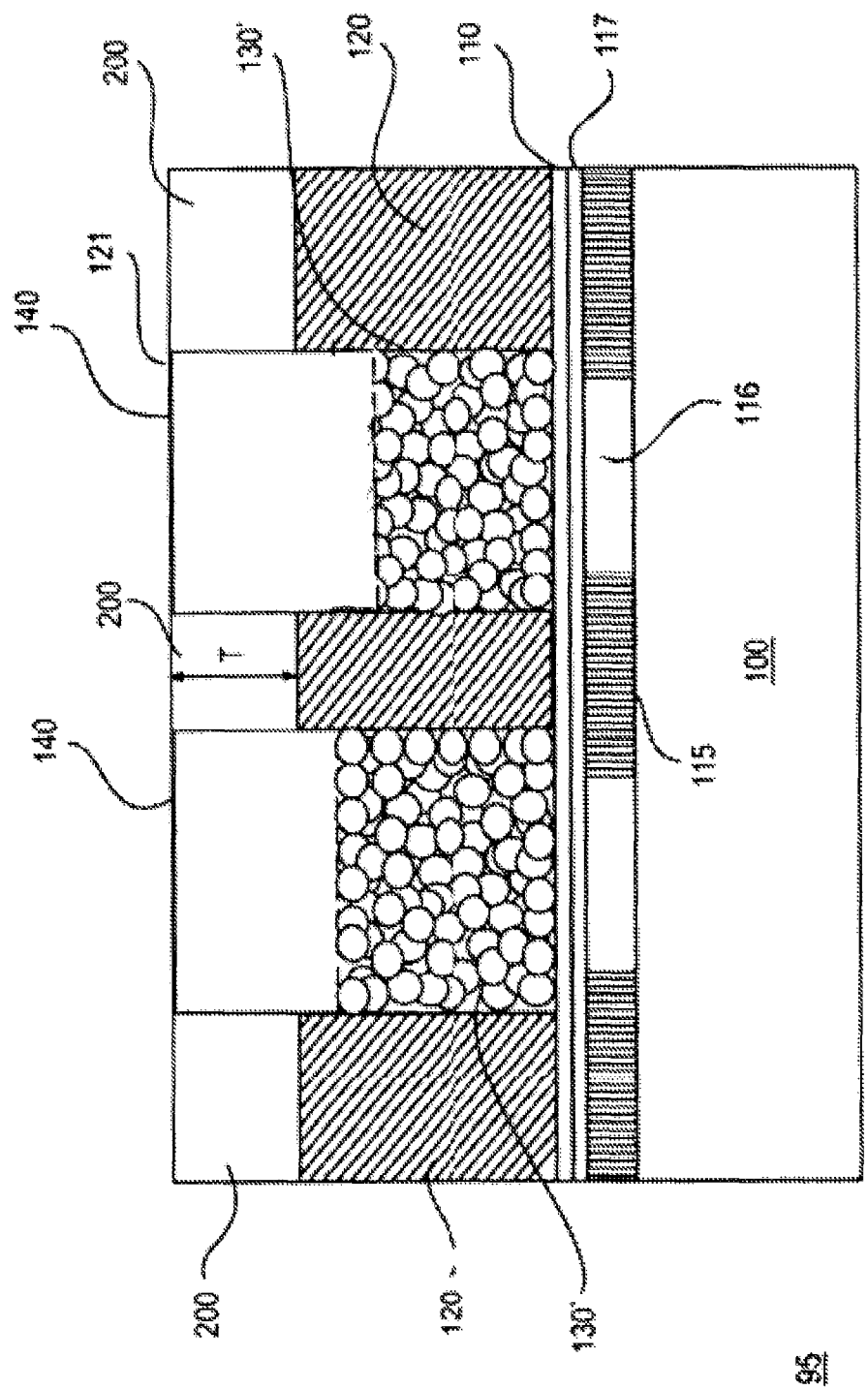
FIG. 4 illustrates the use of a stencil to adjust the height of a solder cap atop a metallic pillar bump structure after sintering the metallic pillar.

Common to all embodiments and equivalent methods disclosed herein, there is a further process that may be used to extend the height (z-direction) and volume of the printed solder 140 over and above that height defined by the thickness of the photoresist layer 120. At process 95, a patterned mechanical stencil (See 200, FIG. 4) of a desired thickness (T) may be laid atop the photoresist layer 120 after the sintering of the powder/flux/MPD mixture 130 in process 40 illustrated in FIGS. 1D, 2D and 3D. Additional solder paste 14 may be deposited into the patterned stencil 200 thereby increasing the total volume of solder by both filling the empty top portion of opening 121 and adding a deposited amount atop opening 121 increasing the height of the overall solder cap 140' following reflow.

The subject matter described above is provided by way of illustration only and should not be construed as being limiting. Various modifications and changes may be made to the subject matter described herein without following the example embodiments and applications illustrated and described, and without departing from the true spirit and scope of the present invention, which is set forth in the following claims.

What is claimed is:

1. A method for creating a metallic pillar on a metallic base layer of a semiconductor device, comprising:
    depositing a photoresist layer over the metallic base layer;
    creating an opening in the photoresist layer having a total volume that is configured to expose the metallic base layer and is further configured to define the metallic pillar;
    substantially filling the total volume of the opening in the photoresist layer with a multi-element metallic paste comprising a metallic portion, a non-metallic portion, and a melting point depressant;
    at least partially driving off the non-metallic portion of the multi-element metallic paste by heating the multi-element paste to a sintering temperature, equal to or greater than the melting point depressant of the multi-element metallic paste, whereby a bottom portion of the total volume of the opening in the photoresist layer retains the metallic portion of the multi-element metallic paste bonded by the melting point depressant, and a top portion of the total volume is empty;
    substantially filling the empty top portion of the total volume with a solder paste;
    forming a solder cap by heating the solder paste to a reflow temperature of the solder paste; and,
    stripping away the photoresist layer.

2. The method of claim 1, wherein the multi-element metallic paste comprises metal powder as the metallic portion and one or both of a flux material and a solvent as the non-metallic portion.

3. The method of claim 2, wherein the melting point depressant has a melting point below the melting point of the metallic portion of the multi-element metallic paste.

4. The method of claim 2, wherein the metallic portion is chosen from a group of metals consisting of Cu, Ni, Pd, Pb, Al, Au, Ag, Zn, Sn, Bi, Sb, Cd, Ga, In, and their alloys.

5. The method of claim 1, wherein the metallic base layer comprises multiple metallic layers each of a different metal or metal alloy, wherein further the multiple metallic layers include one outer bonding layer in contact with the photoresist and includes one or more inner layers.

6. The method of claim 5, wherein the outer bonding layer of the metallic base layer is copper.

7. The method of claim 5, wherein the inner most layer is a metal chosen from the group consisting of Al, Ti, Cu, W, Cr, Ni, V, Au and alloys thereof.

8. The method of claim 5, further comprising increasing the thickness of the outer bonding layer within the opening in the photoresist layer by depositing additional metal thereon.

9. The method of claim 5, wherein the outer bonding layer of the metallic base layer is chosen from the group consisting of Cu, Au, Ni, Ag and alloys thereof.

10. The method of claim 1 wherein the metallic base layer is a single layer of copper.

11. The method of claim 1, wherein the opening in the photoresist layer defines the metallic pillar with a shape selected from a group consisting of one of the following: circular, oval, elongated oval, pentagonal, hexagonal, octagonal, and rectangular with polyangular ends or rounded ends.

12. The method of claim 1, wherein the top portion of the opening in the photoresist is cleaned of flux residue before the solder paste is deposited using at least one of DI water, saponifying chemistries, or a plasma descum.

13. The method of claim 1, wherein the total volume of the opening in the photoresist layer is substantially filled with the multi-element metallic paste via printing or stenciling with the photoresist acting as the stencil.

14. The method of claim 1 wherein an exposed portion of the metallic base layer is etched after the pillar is formed and the photoresist layer is removed.

15. The method of claim 1, wherein the metallic base layer is photo defined and etched to form an under bump metal pad prior to depositing the photoresist layer.

16. The method of claim 1, wherein the empty top portion of the total volume is substantially filled by printing or stenciling the solder paste with the photoresist acting as the stencil.

17. The method of claim 16, further comprising depositing a prescribed amount of additional solder above the opening in the photoresist by one of printing and stenciling the solder paste into a stencil placed atop the photoresist layer, the stencil being configured to deposit a prescribed amount of solder paste atop the opening in the photoresist.

18. The method of claim 1, wherein the metallic pillar is created on the metallic base layer atop one of an underlying metal bond pad of the semiconductor device and a redistributed metal pad of the semiconductor device.

19. The method of claim 18, wherein the metallic pillar is created on the metallic base layer and also atop part of a passivation layer adjacent to the metal bond pad.

20. The method of claim 19, wherein the passivation layer can be comprised of one or more layers of any type or thickness of inorganic or organic passivation materials used in the industry including passivation materials used for the redistribution of metal pads.

21. The method of claim 1, wherein heating the multi-element paste to a the sintering temperature at least partially solders together of the metallic portion of the multi-element metallic paste along with bonding the metallic portion to the metallic base layer.

22. The method of claim 1, wherein the opening in the photoresist layer has a total volume ranging from 2,000 cubic microns to 50,000,000 cubic microns.

23. The method of claim 2, wherein the metal powder portion of the multi-element metallic paste has a particle size range between 0.4 um and 60 um in diameter.

24. A method for creating a metallic pillar on a metallic base layer of a semiconductor device, comprising:
    depositing a photoresist layer over the metallic base layer;
    creating an opening in the photoresist layer having a total volume;
    substantially filling the total volume of the opening in the photoresist layer with a multi-element metallic paste comprising a metallic portion, and a non-metallic portion;
    using a transient liquid phase sintering process at least partially driving off the non-metallic portion of the multi-element metallic paste by heating the multi-element paste to a sintering temperature of the metallic portion of the multi-element metallic paste, whereby a bottom portion of the total volume of the opening in the photoresist layer retains the sintered metallic portion of the multi-element metallic paste and a top portion of the total volume is empty.

25. A method for creating a metallic pillar on a metallic base layer of a semiconductor device, comprising:
    depositing a photoresist layer over the metallic base layer;
    creating an opening in the photoresist layer having a total volume that is configured to expose the metallic base layer and is further configured to define the metallic pillar;

substantially filling the total volume of the opening in the photoresist layer with a multi-element metallic paste comprising a metallic portion, a non-metallic portion, and a melting point depressant chosen from a group of metals consisting of Sn, Ag, Cu, Ni, Bi, Pb, Sb, Cd, In, Ga, Zn, and their alloys;

at least partially driving off the non-metallic portion of the multi-element metallic paste by heating the multi-element paste to a sintering temperature equal to or greater than the melting temperature of the melting point depressant of the multi-element metallic paste, whereby a bottom portion of the total volume of the opening in the photoresist layer retains the sintered metallic portion of the multi-element metallic paste bonded by the melting point depressant and a top portion of the total volume is empty;

substantially filling the empty top portion of the total volume with a solder paste;

forming a solder cap by heating the solder paste to a reflow temperature of the solder paste; and, stripping away the photoresist layer.

\* \* \* \* \*